United States Patent
Rupp et al.

[11] Patent Number: 6,153,012
[45] Date of Patent: Nov. 28, 2000

[54] DEVICE FOR TREATING A SUBSTRATE

[75] Inventors: Roland Rupp, Lauf; Johannes Voelkl, Erlangen, both of Germany

[73] Assignee: Siemens Aktiengesellschaft, Munich, Germany

[21] Appl. No.: 08/868,769

[22] Filed: Jun. 4, 1997

[30] Foreign Application Priority Data

Jun. 4, 1996 [DE] Germany ............................ 196 22 402

[51] Int. Cl.⁷ .................................................. C23C 16/00
[52] U.S. Cl. ........................ 118/715; 118/724; 118/725; 118/620
[58] Field of Search ................... 118/715, 724, 118/725, 620

[56] References Cited

U.S. PATENT DOCUMENTS

| | | | |
|---|---|---|---|
| 3,408,982 | 11/1968 | Capita | 118/49.5 |
| 4,858,557 | 8/1989 | Pozzetti et al. | 118/725 |
| 5,062,386 | 11/1991 | Christensen | 118/725 |
| 5,425,812 | 6/1995 | Tsutahara et al. | 118/725 |
| 5,679,965 | 10/1997 | Schetzina | 257/103 |
| 5,891,251 | 4/1999 | Macleish et al. | 118/719 |

FOREIGN PATENT DOCUMENTS 0 251 825  1/1988  European Pat. Off. .

*Primary Examiner*—Shrive Beck
*Assistant Examiner*—Norca L. Torres
*Attorney, Agent, or Firm*—Kenyon & Kenyon

[57] ABSTRACT

A device for treating at least one substrate comprises a susceptor that is thermally coupled to the substrate and an induction-heating device for heating the susceptor. The induction-heating device and the susceptor are so disposed with respect to one another that an electromagnetic force acting on the susceptor is directed parallel to the force of gravity. As a result, a mechanically and thermally stable structure is assured.

15 Claims, 5 Drawing Sheets

DEVICE FOR TREATING A SUBSTRATE

FIELD OF THE INVENTION

The present invention is directed to a device for treating a substrate.

BACKGROUND INFORMATION

Published European Patent Application No. 0 251 825 describes a device for depositing epitaxial layers on substrates by using chemical vapor deposition (CVD). This known device comprises a plurality of susceptors that are arranged vertically with respect to the ground. That is, these susceptors are arranged parallel to the direction of the force of gravity. On each susceptor a plurality of substrates are mounted thereon, and each susceptor is rotatable along its longitudinal axis. The susceptors are arranged along a circular curve around a likewise vertically disposed, centrally configured gas-inlet pipe. The gas-inlet pipe includes ports through which process gases flow in order to deposit the epitaxial layers on the substrates. The flow of such process gases toward the substrates is perpendicular to the vertical longitudinal alignment of the susceptors.

U.S. Pat. No. 3,408,982 describes another device for depositing epitaxial layers on substrates by means of CVD. In particular, the device described therein is intended to manufacture silicon epitaxial layers at an operating temperature range of 1190° C. to 1450° C. This known device comprises a plate-shaped susceptor that is disposed horizontally (that is, perpendicularly to the force of gravity). The susceptor is coupled to a rotating shaft that is arranged vertically (that is, parallel to the force of gravity). In one specific embodiment, the substrates are arranged horizontally on the susceptor. The rotating shaft draws the CVD process gases upward into a gas chamber located above the susceptor plate. As the gases enter the gas chamber, they flow through a center portion of the susceptor into a gas chamber. The gases radially expand in a uniform manner inside the chamber, first traveling up and away from the susceptor plate and then back down to strike the substrates in the direction of the force of gravity. Arranged beneath the substrates is an induction heating coil, which has a flat spiral shape referred to as a pancake coil. In another specific embodiment, the susceptor plate is beveled at an angle toward the top at its edges, and the substrates are inwardly inclined on the oblique portion of the susceptor plate to compensate for the centrifugal force. The associated induction coil is likewise disposed at the same angle as the beveled portion of the susceptor plate.

A drawback of the '982 patent is that the electromagnetic forces generated by the induction coils destabilize the intended, designated positions of the susceptor, and consequently, of the substrates as well. As a result, the destabilization of the susceptor positioning introduces undesired variations into the temperature distribution of the substrates.

SUMMARY OF THE INVENTION

An object of the present invention is to provide a device for treating a substrate by using an induction-heating device and a corresponding susceptor to heat the substrate without producing electromagnetic forces that would substantially influence the position of the susceptor during the treatment of the substrate.

In order to achieve this object, the device of the present invention includes at least one susceptor thermally coupled to at least one substrate and an induction-heating device that inductively heats the at least one susceptor. The induction-heating device comprises, in particular, at least one induction coil, which is preferably driven by a high-frequency voltage source. The induction-heating device and the at least one susceptor are arranged with respect to one another in such a way that an electromagnetic force acting on the at least one susceptor because of the induction-heating device is at least nearly equidirectional to the force of gravity.

In contrast to known systems in which the electromagnetic force exerted on the susceptor by the induction heating process is antiparallel to the force of gravity, the present invention provides a structure that is both mechanically and thermally stable.

In a first exemplary embodiment, at least one substrate is disposed between the at least one susceptor and the induction coil.

In another embodiment, the at least one susceptor is disposed between the induction coil and the at least one substrate. The side of the susceptor that faces away from the induction coil can be provided with at least one insertion bracket for securing the at least one substrate. Furthermore, the susceptor of this embodiment can be supported on a supporting rod. In addition, the device can include at least one supporting device for carrying the at least one substrate and the at least one susceptor. The supporting device may be embodied in the form of a supporting shell having an opening and a bearing surface surrounding the opening for each substrate. The susceptor is insertable in the supporting shell, and the supporting shell can be supported by the supporting rod.

In order to deposit a layer on the substrate, the device of the present invention includes means for directing a process gas stream at the surface of the least one substrate in order to chemically precipitate the layer out of the process gas stream. These means for directing the process gas stream are capable of directing the flow direction of the gas stream, at least in the area of the substrate surface, in a manner that is nearly antiparallel to the force of gravity. One preferred application of the device is the deposition of a layer of monocrystalline silicon carbide or of monocrystalline gallium nitride on a substrate.

In another embodiment, the device of the present invention includes a rotational means for rotating each substrate about a shared axis of rotation or, in each case, a predefined axis of rotation. For an embodiment having a supporting rod, the supporting rod can be rotated about its longitudinal axis. For an embodiment having a supporting shell, the entire supporting shell can be rotated.

DETAILED DESCRIPTION

Figure 1:
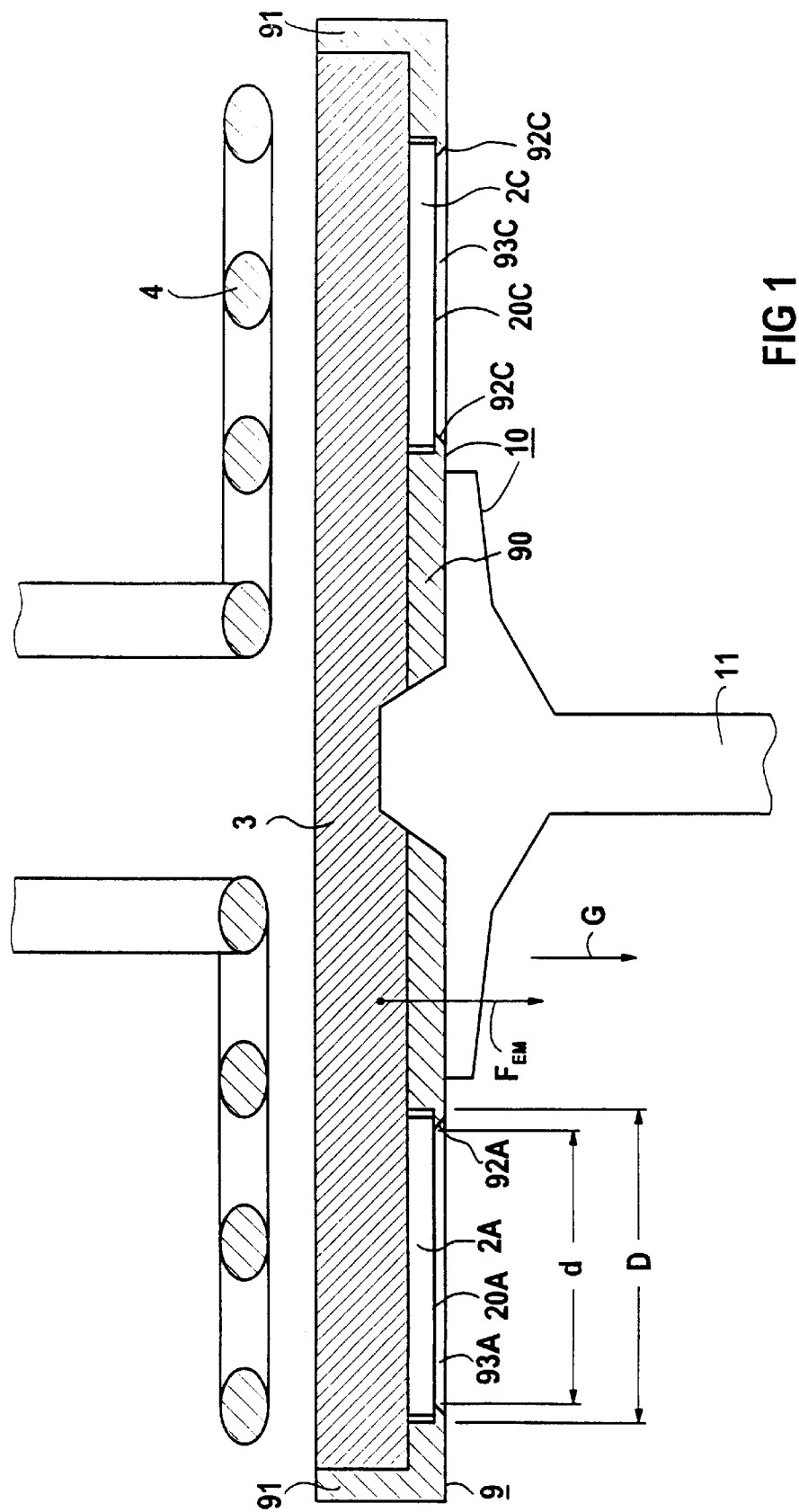
FIG. 1 shows a cross-section view of a device for treating a plurality of substrates comprising a supporting device for the substrates.
Figure 2:
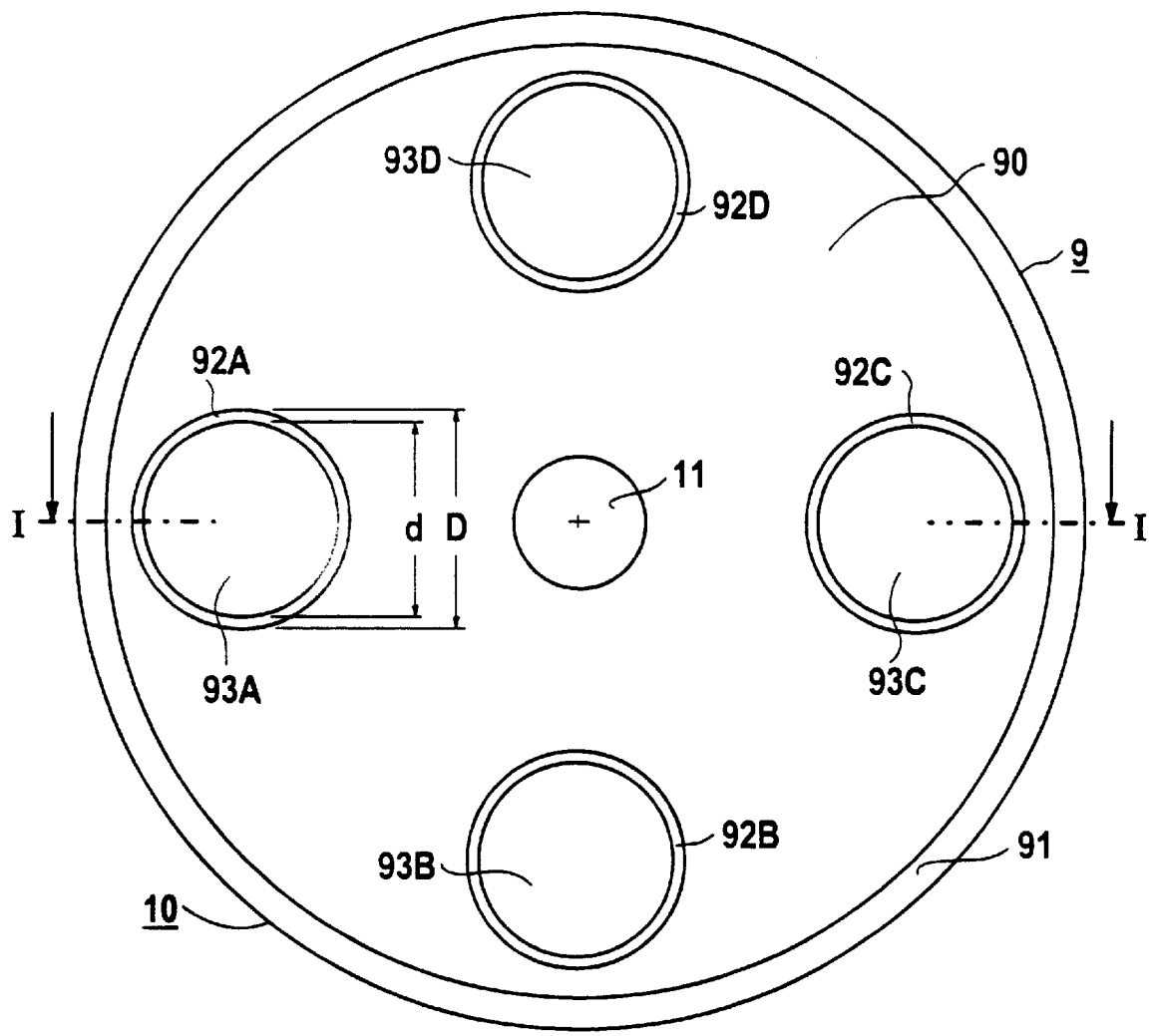
FIG. 2 shows a top view of the supporting device of FIG. 1.

FIG. 1 illustrates an apparatus for treating at least one substrate in accordance with the present invention. The apparatus includes a supporting device 10 for supporting the at least one substrate, a susceptor 3, an induction coil 4, and a supporting rod 11. FIG. 2 illustrates a top view of the supporting device 10 without the susceptor 3 and the induction coil 4. In the cross-section of FIG. 1, two substrates (2A and 2C) are shown; in the top view of FIG. 2, four substrates (2A, 2B, 2C and 2D) are illustrated. Supporting device 10 comprises a supporting shell 9 and a supporting rod 11, which supports supporting shell 9 by having a portion thereof inserted through a center region of the shell 9. Supporting shell 9 comprises a base plate 90 and an upwardly projecting, lateral rim 91. In base plate 90, openings 93A through 93D are provided for respectively receiving substrates 2A-2D. Formed around each of openings 93A through 93D are bearing surfaces 92A through 92D. Each bearing surface supports one of substrates 2A through 2D. Since bearing surfaces 92A through 92D are set back in the base plate 90, a cylindrical support having an inner diameter d defined by the opening 93A through 93D, and an outer diameter D defined by the radial extent of bearing surface 92A through 92D, is formed for the substrate. The inner diameter d is selected to be smaller than the diameter of substrates 2A through 2D, while the outer diameter D is selected to be larger than the diameter of substrates 2A through 2D. Besides the illustrated circular shape, bearing surfaces 92A through 92D can, of course, also be adapted to other substrate shapes, e.g., a rectangular shape.

FIG. 2 shows only four bearing surfaces 92A through 92D. Generally, however, more than four bearing surfaces are provided for a corresponding number of more substrates, and these bearing surfaces are also disposed as closely together as possible.

The susceptor 3 is introduced into supporting shell 9 after substrates 2A through 2D have been placed in corresponding bearing surfaces 92A through 92D. The susceptor 3 is preferably adapted to the inside diameter of supporting shell 9 and, in particular, can have a circular disk shape. Susceptor 3 is thermally coupled to substrates 2A through 2D. The thermal coupling can take place by means of thermal conduction or by means of thermal radiation, or both. For this purpose, susceptor 3 is placed in direct contact with substrates 2A through 2D. Supporting shell 9 can preferably be slipped onto supporting rod 11 and, thus, detachably connected. This operation facilitates substrate replacement following treatment. Induction coil 4 is preferably a flat coil in the form of a pancake coil and is arranged above susceptor 3 at a position that is at least nearly parallel to supporting shell 9 and to substrates 2A through 2D, as well as to susceptor 3.

Susceptor 3 comprises an electrically conductive material. When a preferably high-frequency a.c. voltage is applied to induction coil 4, eddy currents are induced in susceptor 3 and are converted into Joulean heat. As a result of the thermal coupling, this heat is transferred from susceptor 3 to substrates 2A through 2D. Because of the induction, which occurs according to Lenz's law, an electromagnetic force (force vector) $F_{EM}$ acts on susceptor 3. The result of the special configuration of susceptor 3 and induction coil 4 relative to one another is that the electromagnetic force $F_{EM}$ is equidirectional to the force produced by the weight of susceptor 3 and, thus, to gravitational force (force vector) G. For the purposes of this discussion, the term "equidirectional" means that the corresponding force arrows (vectors) point in the same direction. The entire force acting on susceptor 3 is expressed as vectorial sum $F_{EM}+G$ of electromagnetic force $F_{EM}$ and of gravitational force G. This entire force $F_{EM}+G$ always points in the direction of gravitational force G independently of the current flow in induction coil 4 and, in terms of absolute value, is always at least as great as the amount of the gravity G acting on susceptor 3. Consequently, susceptor 3 is always retained in its position and does not lift off from substrates 2A through 2D during the operation of induction coil 4. This assures a uniform application of heat to substrates 2A through 2D and uniform temperatures at their substrate surfaces 20A through 20D. Moreover, since substrates 2A through 2D are pressed by their own weight and the weight of susceptor 3 against corresponding bearing surfaces 92A through 92D, virtually no impurities from susceptor 3 can reach the treated substrate surfaces 20A through 20D. The impurities produced by susceptor 3 are especially critical, since the temperature of susceptor 3 is generally the highest in the entire system. Thus, in particular, when an epitaxial layer is grown on each substrate 2A through 2D, the quality of the growing epitaxial layer is improved.

In the embodiment of FIGS. 1 and 2, the exposed surfaces 20A through 20D of substrates 2A through 2D that are treated by the above-described process are opposite to the substrate surfaces that are closest to induction coil 4. These surfaces are preferably directed vertically to gravitational force G. By this means, substrates 2A through 2D are pressed by their own weight against bearing surfaces 92A through 92D, and a stable thermal coupling to susceptor 3 is achieved.

Figure 3:
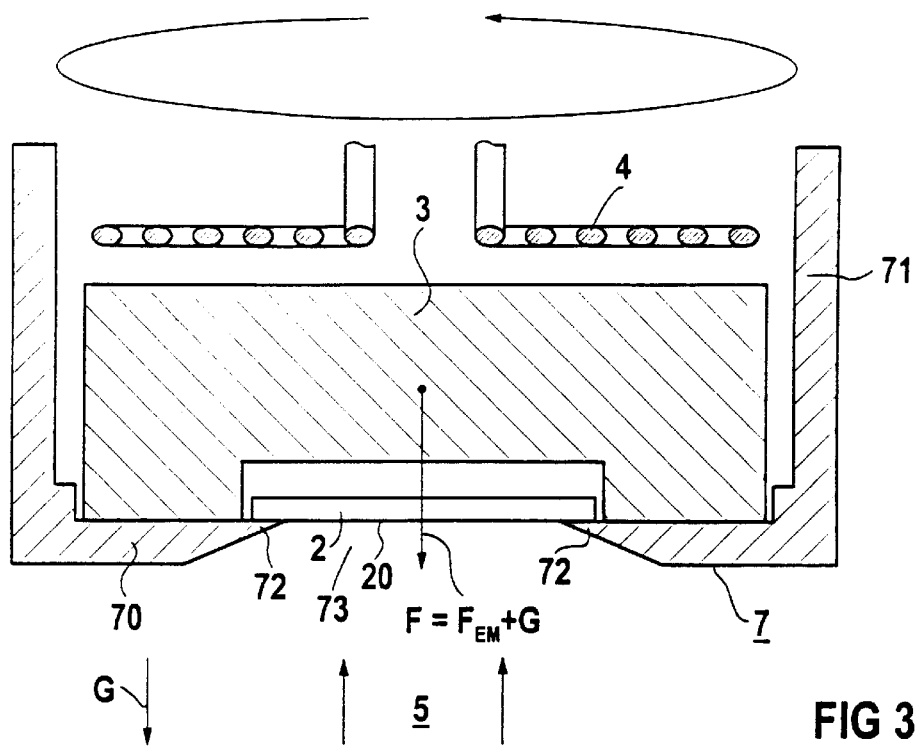
FIG. 3 illustrates an embodiment of a device for coating a substrate from below, comprising a supporting device, rotatable from above, for the substrate.

FIG. 3 illustrates an embodiment of a device for treating a substrate 2. Substrate 2 rests with its edge on a bearing surface 72 of a supporting device 7. Bearing surface 72 forms the edge of an opening 73 in a base plate 70 of supporting device 7. The downward facing surface 20 of substrate 2 (i.e., the surface facing away from susceptor 3) is accessible through opening 73 in base plate 70. By providing a suitable process gas stream (denoted by 5) that flows up from below to surface 20 of substrate 2, the apparatus of FIG. 3 can etch surface 20 or, alternatively, deposit on this surface a layer through a CVD process. In order to accommodate the flow dynamics of gas streams, bearing surface 72 includes an upwardly inclining bottom surface that is angled with respect to the top horizontal surface of bearing surface 72. As a result of this configuration, the diameter of surface 72 decreases continuously toward substrate 2. Bearing surface 72 and substrate 2 resting thereon are essentially oriented perpendicularly to gravitational force G. Besides base plate 70, supporting device 7 has a lateral section 71, which, for example, can have a hollow cylindrical design and extend upwards, and thus opposite to gravitational force G. Supporting device 7 is preferably rotatable from above about an axis of rotation running preferably parallel to gravitational force G. Arranged on base plate 70 in supporting device 7 is a susceptor 3, which is delimited by lateral section 71 and is thermally coupled to substrate 2. Disposed again above susceptor 3 is an induction coil 4. The total force $F=F_{EM}+G$ resulting on susceptor 3 is indicated by an arrow showing the direction of this acting force, and is always equidirectional to gravitational force G, so that susceptor 3 remains on supporting device 7. This arrangement assures that a constant thermal coupling to substrate 2, as well as a stable mechanical structure is achieved.

Figure 4:
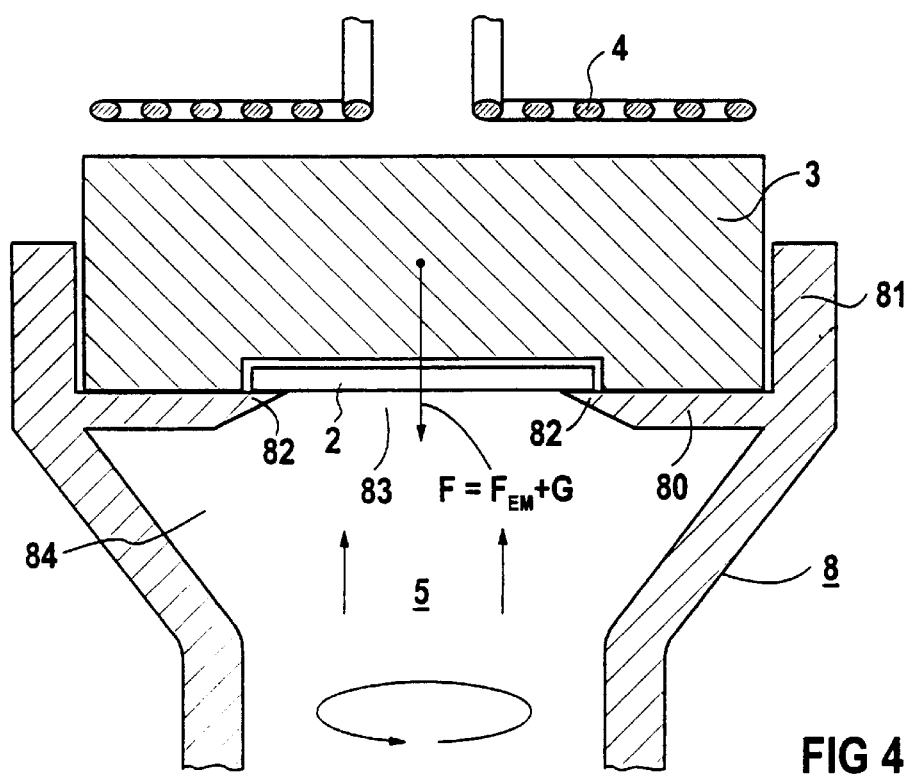
FIG. 4 represents a device for coating a substrate from below, comprising a supporting device, rotatable from below, for the substrate.

The design of the device in FIG. 4 is similar to that of FIG. 3, but with a transformed supporting device, denoted by 8. Like supporting device 7 in FIG. 3, supporting device 8 has a base plate 80 with an opening 83 and a bearing surface 82, upon which substrate 2 rests. However, supporting device 8 does not extend upwards as in FIG. 3, but rather downwards along the direction of gravitational force G and, with respect to substrate 2, is secured at the bottom. Furthermore, supporting device 8 is hollow on the inside and is traversed by the flow of process gases 5 in hollow space 84 that it encloses. To remove process gases 5 after they strike against substrate 2, openings (not shown) are preferably provided in the upper area of supporting device 8. Preferably, hollow space 84 is tapered toward the bottom within supporting device 8 and assumes, there, the shape of a shaft. Preferably, this shaft-shaped section of supporting device 8 is connected to rotational means, for example a motor, in order to rotate substrate 2 during the treatment about an axis of rotation preferably directed parallel to gravitational force G. Disposed again on base plate 80 of supporting device 8 and surrounded by a lateral section 81 is a susceptor 3, which is inductively heated by an induction coil 4 arranged over susceptor 3 in order to heat substrate 2. Susceptor 3 is placed upon substrate 2 with the most accurate possible fit.

Figure 5:
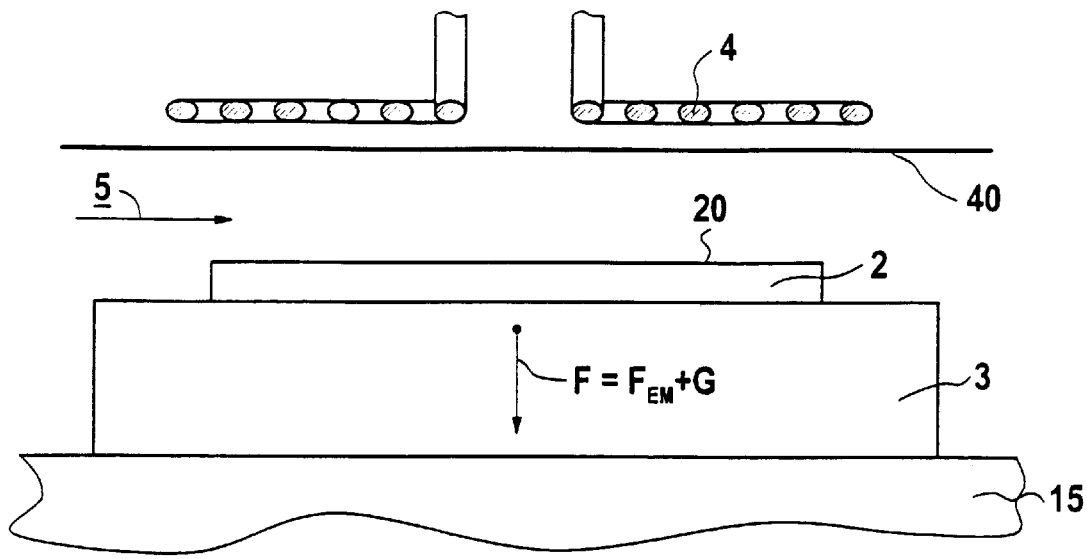
FIG. 5 shows a device for coating a substrate using horizontal process-gas flow control.

FIG. 5 depicts another embodiment of a device for treating a substrate 2. In this embodiment, substrate 2 is arranged with its entire bottom side resting flat on susceptor 3, which is preferably arranged on a support 15. An induction coil 4 is arranged above substrate 2, so that substrate 2 is disposed between induction coil 4 and susceptor 3. In the embodiment shown in FIG. 5, process gases 5 flow in the horizontal direction, i.e., parallel to surface 20 of substrate 2, over surface 20. To prevent process gases 5 from making contact with induction coil 4, a symbolically depicted partition wall 40 can be provided. In the embodiment shown, the structural design is stable because the electromagnetic force $F_{EM}$ and the total force $F = F_{EM} + G$ acting on susceptor 3 are equidirectional to the gravitational force G acting on susceptor 3. As a consequence, susceptor 3 is not able to lift up from support 15 in response to changing electrical energy in induction coil 4.

Figure 6:
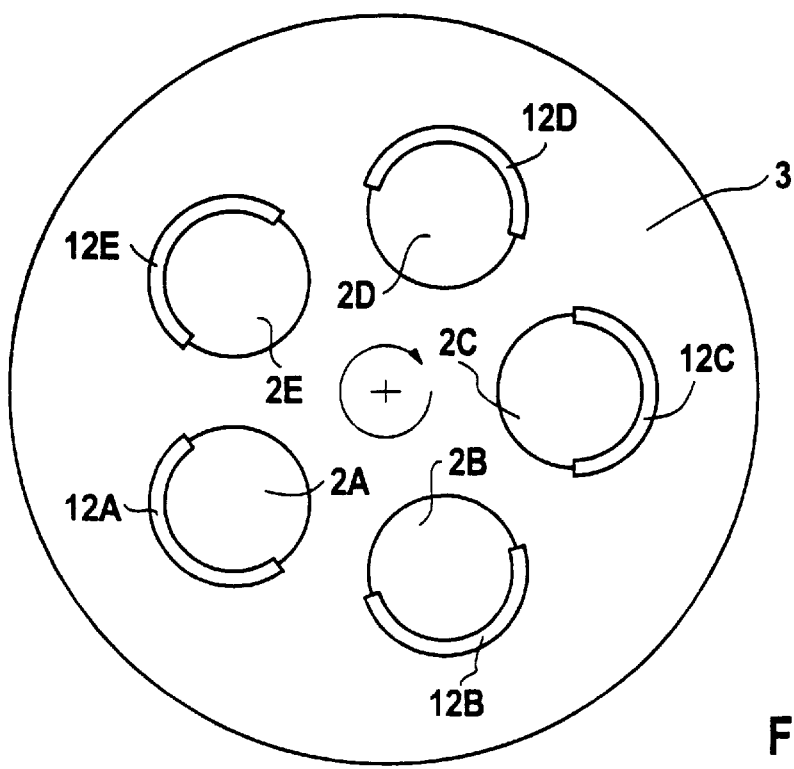
FIG. 6 is a representation of a supporting device having insertion brackets for a plurality of substrates.

FIG. 6 depicts an embodiment in which the susceptor itself is provided as a supporting device for the at least one substrate. In FIG. 6, a susceptor 3 is shown from below. On its bottom side, susceptor 3 has insertion brackets (holding pockets) 12A through 12E for each of substrates 2A through 2E. The insertion brackets 12A-12E are adapted to conform to the form of associated substrates 2A through 2E, respectively, and are semicircular in the example of FIG. 6. Substrates 2A through 2E can be laterally inserted into and retained by corresponding insertion brackets 12A through 12E. Susceptor 3 is preferably centrally rotated about an axis of rotation. The substrates 2A through 2E are further mechanically stabilized by the radial arrangement of insertion brackets 12A through 12E, in which substrates 2A through 2E are pressed into corresponding insertion brackets 12A through 12E by the centrifugal force resulting from the rotation of susceptor 3. In this specific embodiment, substrates 2A through 2E are treated from below, i.e., viewed from the bottom side of susceptor 3. The induction coil (not shown) is arranged on the top side of susceptor 3.

Figure 7:
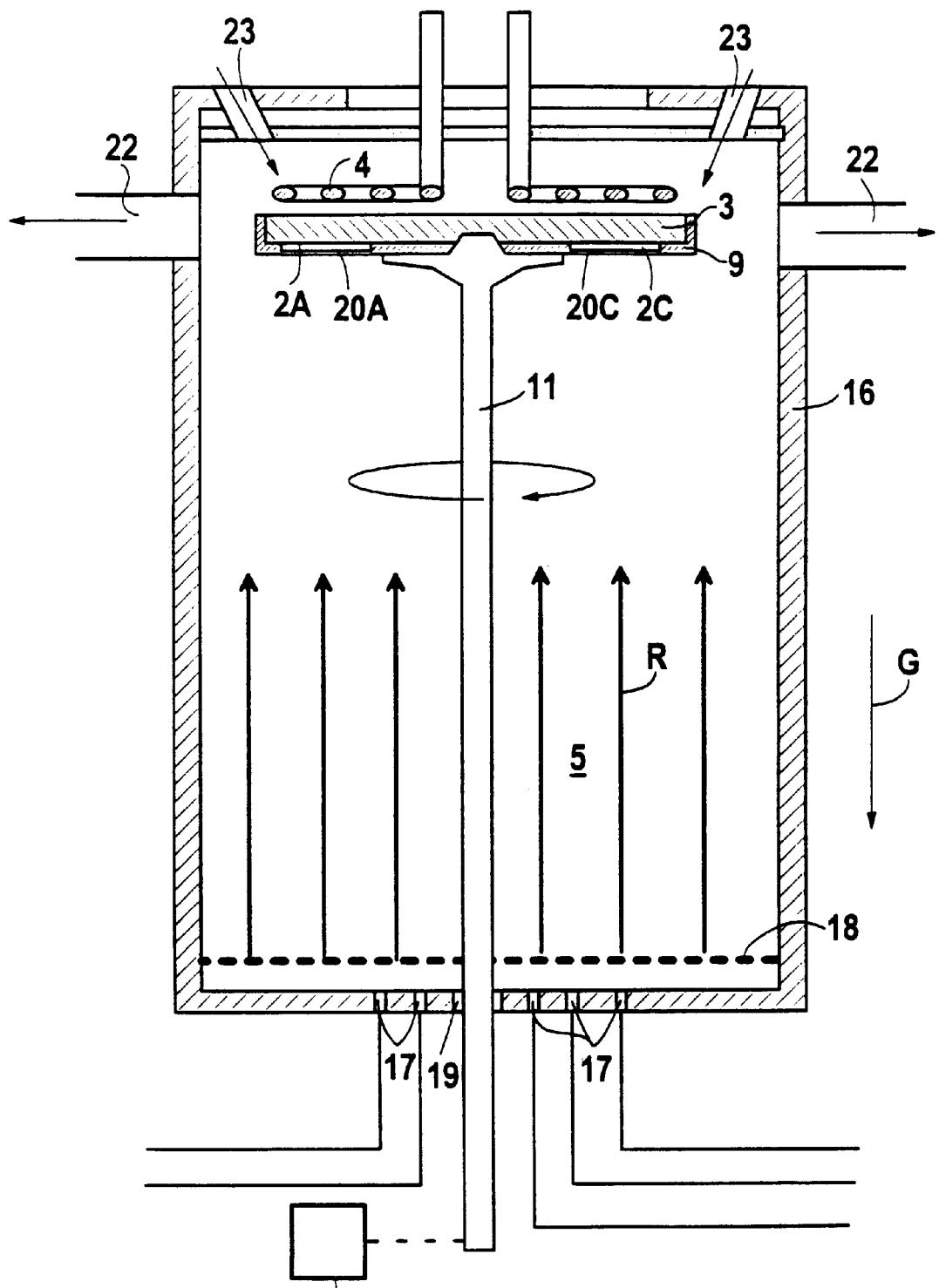
FIG. 7 illustrates a device for treating a plurality of substrates with process gas being supplied from below.

FIG. 7 illustrates an apparatus for depositing layers onto a plurality of substrates by means of CVD. The apparatus contains a supporting device with a supporting shell 9, a supporting rod 11, as well as a susceptor 3, and an induction coil 4. These elements are analogous in design to the corresponding elements of FIG. 1. This structure is mounted in a reactor 16, on whose bottom side, i.e., with respect to the direction of gravity G, means are provided underneath substrates 2A and 2C for directing a process gas stream 5 toward substrate surfaces 20A and 20C. The means for directing process gas stream 5 comprise gas-inlet orifices 17 in reactor 16, through which the various process gases are directed into reactor 16, and a diffusor 18, which produces a homogenous process gas stream 5. Diffusor 18 can be constituted of a wire mesh having a specified mesh aperture. Process gas stream 5 flows from a spatial area 22 having lower temperatures than substrates 2A through 2E to substrate surfaces 20A through 20E and is then laterally deflected and directed via outlets 24 that communicate with pumps out of reactor 16. To protect induction coil 4 from process gas stream 5, gas inlets 23 are preferably provided, by way of which induction coil 4 and susceptor 3 are purged with an inert gas such as, for example, argon. Supporting rod 11, upon which supporting shell 9 is mounted, passes through the bottom of reactor 16 via a gas-tight opening, in particular a rotary seal, which is located outside of reactor 16. Provision is made there for rotational means 21, which are operatively connected to supporting rod 11 and are able to rotate supporting rod 11 along its longitudinal axis. In this context, the rotational speed is variably adjusted to conform with the prevailing requirements. As rotational means 21, for example, an electromotor with a suitable speed transformation can be provided.

The flow direction of process gas stream 5 directed in an opposite direction to gravitational force G is denoted by R and points in the direction of the illustrated arrows. As a result of the antiparallel alignment of flow direction R and gravitational force G, a stable thermal stratification is achieved in the gas-filled space within reactor 16 with virtually no signs of turbulence. All parameters such as rotational speed, pressure, and gas flow (flow rate) can now be freely optimized to improve the growth process without having to accept any degradation of flow properties.

The device in accordance with the present invention is preferably used for growing layers on substrates, in particular for growing monocrystalline silicon carbide layers or monocrystalline gallium nitride layers by means of a CVD process.

In order to grow SiC layers, the process gas stream 5 includes silicon (Si) and carbon (C) and preferably at least one carrier gas, generally hydrogen, and optionally also a doping gas for doping the growing silicon carbide. When the gas mixture of process gas stream 5 strikes the heated substrate, silicon carbide is precipitated out of the process gas by a chemical reaction, with the participation of the hydrogen carrier gas, silicon carbide. Substrates of monocrystalline silicon carbide (epitaxy) are used, in particular, as substrates. The temperatures at the substrate are adjusted by varying the energy of induction coil 4. To grow silicon carbide, growth temperatures of between about 900° C. and about 2500° C. are achieved at the substrate.

The device can also be used for producing monocrystalline gallium nitride (GaN) layers by means of CVD. The substrates for growing the GaN layers can be comprised, in particular, of $Al_2O_3$ or also of SiC. The growth temperatures at the substrate are adjusted during the GaN-CVD process preferably between about 950° C. and about 1100° C. Working gases that are particularly well-suited for the process include ammonia and gallium carbon compounds, such as trimethyl- or triethylgallium.

Supporting shell 9 and supporting rod 11 are preferably coated with a material that is inert with respect to process gas stream 5, or at least with an inert material, such as tantalum carbide or silicon carbide, for producing SiC layers. Moreover, supporting rod 11 can also be purged with an inert gas in order to prevent contact with process gas stream 5. Preferably, supporting rod 11 is also movable across gas-tight opening 19 along its longitudinal axis in order to facilitate insertion and removal of the substrates into and out of reactor 16.

What is claimed is:

1. A device for treating at least one substrate, comprising:
    at least one susceptor thermally coupled to the at least one substrate; and
    an induction-heating device for inductively heating the at least one susceptor wherein the inductively heating device generates an electromagnetic force which acts on the at least one susceptor, and wherein the induction-heating device and the at least one susceptor are arranged with respect to one another so that the electromagnetic force acting on the at least one susceptor is directed substantially parallel to a gravitational force.

2. The device according to claim 1, wherein the induction-heating device comprises at least one induction coil.

3. The device according to claim 2, wherein the at least one susceptor is disposed between the induction coil and the at least one substrate.

4. The device according to claim 1, further comprising at least one supporting device for supporting the at least one substrate and the at least one susceptor.

5. The device according to claim 4, further comprising a supporting rod, upon which the supporting device is supported.

6. The device according to claim 3, wherein the susceptor includes a side facing away from the induction coil, and wherein the side of the susceptor facing away from the induction coil includes at least one insertion bracket for securing a corresponding one of the at least one substrate.

7. The device according to claim 5, further comprising rotational means, coupled to the supporting rod, for rotating each substrate about a predefined axis of rotation.

8. The device according to claim 1, further comprising means for depositing a layer on a surface of the at least one substrate, wherein the means for depositing includes means for directing a process gas stream at the surface of the at least one substrate, whereby the layer is chemically precipitated out of the process gas stream.

9. The device according to claim 8, wherein the means for directing directs the process gas stream in a flow direction that is substantially opposite and parallel to the gravitational force near the surface of the at least one substrate.

10. The device according to claim 8, wherein the deposited layer comprises monocrystalline silicon carbide.

11. The device according to claim 9, wherein the deposited layer comprises monocrystalline silicon carbide.

12. The device according to claim 8, wherein the deposited layer comprises monocrystalline gallium nitride.

13. The device according to claim 9, wherein the deposited layer comprises monocrystalline gallium nitride.

14. A device for treating at least one substrate, comprising:
    at least one susceptor thermally coupled to the at least one substrate; and
    an induction-heating device for inductively heating the at least one susceptor wherein the inductively heating device generates an electromagnetic force which acts on the at least one susceptor, and wherein the induction-heating device and the at least one susceptor are arranged with respect to one another so that the electromagnetic force acting on the at least one susceptor is directed substantially parallel to a gravitational force, the induction-heating device including at least one induction coil, the at least one substrate being disposed between the at least one susceptor and the induction coil.

15. A device for treating at least one substrate, comprising:
    at least one susceptor thermally coupled to the at least one substrate;
    an induction-heating device for inductively heating the at least one susceptor wherein the inductively heating device generates an electromagnetic force which acts on the at least one susceptor, and wherein the induction-heating device and the at least one susceptor are arranged with respect to one another so that the electromagnetic force acting on the at least one susceptor is directed substantially parallel to a gravitational force; and
    at least one supporting device for supporting the at least one substrate and the at least one susceptor, the supporting device including a supporting shell having at least one opening surrounded by an associated bearing surface for supporting the at least one substrate, and wherein the susceptor is insertable in the supporting shell.

* * * * *